United States Patent
Usui

(10) Patent No.: US 10,020,407 B2
(45) Date of Patent: Jul. 10, 2018

(54) COOLING STRUCTURE FOR PHOTOELECTRIC CONVERSION ELEMENT

(71) Applicant: OLYMPUS CORPORATION, Tokyo (JP)

(72) Inventor: Shogo Usui, Tokyo (JP)

(73) Assignee: OLYMPUS CORPORATION, Tokyo (JP)

( * ) Notice: Subject to any disclaimer, the term of this patent is extended or adjusted under 35 U.S.C. 154(b) by 82 days.

(21) Appl. No.: 15/148,129

(22) Filed: May 6, 2016

(65) Prior Publication Data
US 2016/0365461 A1 Dec. 15, 2016

(30) Foreign Application Priority Data

Jun. 9, 2015 (JP) .................. 2015-116610

(51) Int. Cl.
*H01L 31/024* (2014.01)
*H01L 27/146* (2006.01)
*H01L 23/38* (2006.01)

(52) U.S. Cl.
CPC ............ *H01L 31/024* (2013.01); *H01L 23/38* (2013.01); *H01L 27/14618* (2013.01)

(58) Field of Classification Search
CPC .................................................... H01L 31/024
See application file for complete search history.

(56) References Cited

U.S. PATENT DOCUMENTS

| | | | | |
|---|---|---|---|---|
| 5,625,227 A | * | 4/1997 | Estes | .................. H01L 23/3675 257/712 |
| 6,223,815 B1 | * | 5/2001 | Shibasaki | ............... F28F 13/00 165/185 |
| 6,654,250 B1 | * | 11/2003 | Alcoe | .................... H05K 1/189 257/719 |
| 6,870,258 B1 | * | 3/2005 | Too | ........................ H01L 21/50 257/704 |

(Continued)

FOREIGN PATENT DOCUMENTS

| | | |
|---|---|---|
| EP | 2 234 151 A1 | 9/2010 |
| JP | H09-082857 A | 3/1997 |

(Continued)

OTHER PUBLICATIONS

Extended European Search Report dated Dec. 21, 2016 in related European Patent Application No. 16 16 9322.1.

*Primary Examiner* — Eugene Lee
(74) *Attorney, Agent, or Firm* — Scully, Scott, Murphy & Presser, P.C.

(57) ABSTRACT

This cooling mechanism for a surface-mounted-type photoelectric conversion element is provided on a circuit board to which a surface-mounted-type photoelectric conversion element, which has a signal terminal that is connected to inner wiring and a terminal for fixation that is not connected to the inner wiring on a back surface thereof, is mounted, the cooling mechanism has a front-surface-side copper foil pattern to which the terminal for fixation is connected, a back-surface-side copper foil pattern, and a through-hole via which connects the copper foil patterns, a cooling member (Continued)

which is fixed to the circuit board so as to have contact with the back-surface-side copper foil pattern, and which cools the back-surface-side copper foil pattern.

9 Claims, 17 Drawing Sheets

(56) References Cited

U.S. PATENT DOCUMENTS

| | | | | |
|---|---|---|---|---|
| 8,159,822 | B2* | 4/2012 | Kanschat | H01L 23/24 |
| | | | | 165/184 |
| 2006/0267182 | A1* | 11/2006 | Rumer | H01L 23/40 |
| | | | | 257/706 |
| 2010/0243872 | A1* | 9/2010 | Amano | H01L 27/14618 |
| | | | | 250/238 |
| 2011/0027930 | A1* | 2/2011 | El-Gamal | B81C 1/00301 |
| | | | | 438/51 |
| 2015/0061139 | A1* | 3/2015 | Yap | H01L 24/26 |
| | | | | 257/773 |
| 2015/0185411 | A1* | 7/2015 | Ikuta | G02B 6/0086 |
| | | | | 348/790 |
| 2015/0195433 | A1* | 7/2015 | Lin | H04N 5/2252 |
| | | | | 348/374 |

FOREIGN PATENT DOCUMENTS

| | | |
|---|---|---|
| JP | H09-289329 A | 11/1997 |
| JP | 2011-120044 A | 6/2011 |
| JP | 2012-085024 A | 4/2012 |
| WO | 2011/067984 A1 | 6/2011 |

* cited by examiner

COOLING STRUCTURE FOR PHOTOELECTRIC CONVERSION ELEMENT

CROSS-REFERENCE TO RELATED APPLICATIONS

This application is based on Japanese Patent Application No. 2015-116610, the contents of which are incorporated herein by reference.

TECHNICAL FIELD

The present invention relates to a cooling structure for a photoelectric conversion element.

BACKGROUND ART

A conventional and known cooling-type imaging device cools the imaging element by forming a through hole in a printed circuit board on which the imaging element is mounted and which is to be installed in a digital camera, in which the thorough hole is for exposing the back surface of the imaging element, and the through hole is for making a cooling means, which is a heat sink, for example, and which is located at a back surface side of the printed circuit board, come into direct contact with the back surface of the imaging element. (See Patent Literature 1, for example.)

Also, Patent Literature 2 discloses a technique in which copper foil pattern of the power supply terminals of the imaging element is utilized for heat dissipation when imaging elements are mounted on the front surface of printed circuit boards. (See Patent Literature 2, for example.)

CITATION LIST

Patent Literature

{PTL 1} Japanese Unexamined Patent Application, Publication No. 2011-120044
{PTL 2} Japanese Unexamined Patent Application, Publication No. 2012-85024

SUMMARY OF INVENTION

An aspect of the present invention is a cooling mechanism for a surface-mounted-type photoelectric conversion element which has a signal terminal and a terminal for fixation at a back surface thereof, wherein the signal terminal is connected to internal wiring and the terminal for fixation is not connected to the internal wiring, the cooling mechanism comprising the following elements: a front-surface-side copper foil pattern which is provided on a front surface of a circuit board and to which the terminal for fixation is connected, the front surface being located at one side in the thickness direction of the circuit board; a back-surface-side copper foil pattern which is provided on a back surface of the circuit board, the back surface being located at the other side in the thickness direction of the circuit board; a through-hole via which connects the front-surface-side copper foil pattern and the back-surface-side copper foil pattern; and a cooling member which is fixed to the circuit board so as to have contact with the back-surface-side copper foil pattern, and which cools the back-surface-side copper foil pattern.

DESCRIPTION OF EMBODIMENTS

First Embodiment

A cooling-type imaging device in which a cooling mechanism for a photoelectric conversion element according to a first embodiment of the present invention is employed will be described below with reference to the drawings. In this embodiment, an imaging element, such as a CMOS imaging element or the like, is employed as the photoelectric conversion element.

Figure 1:
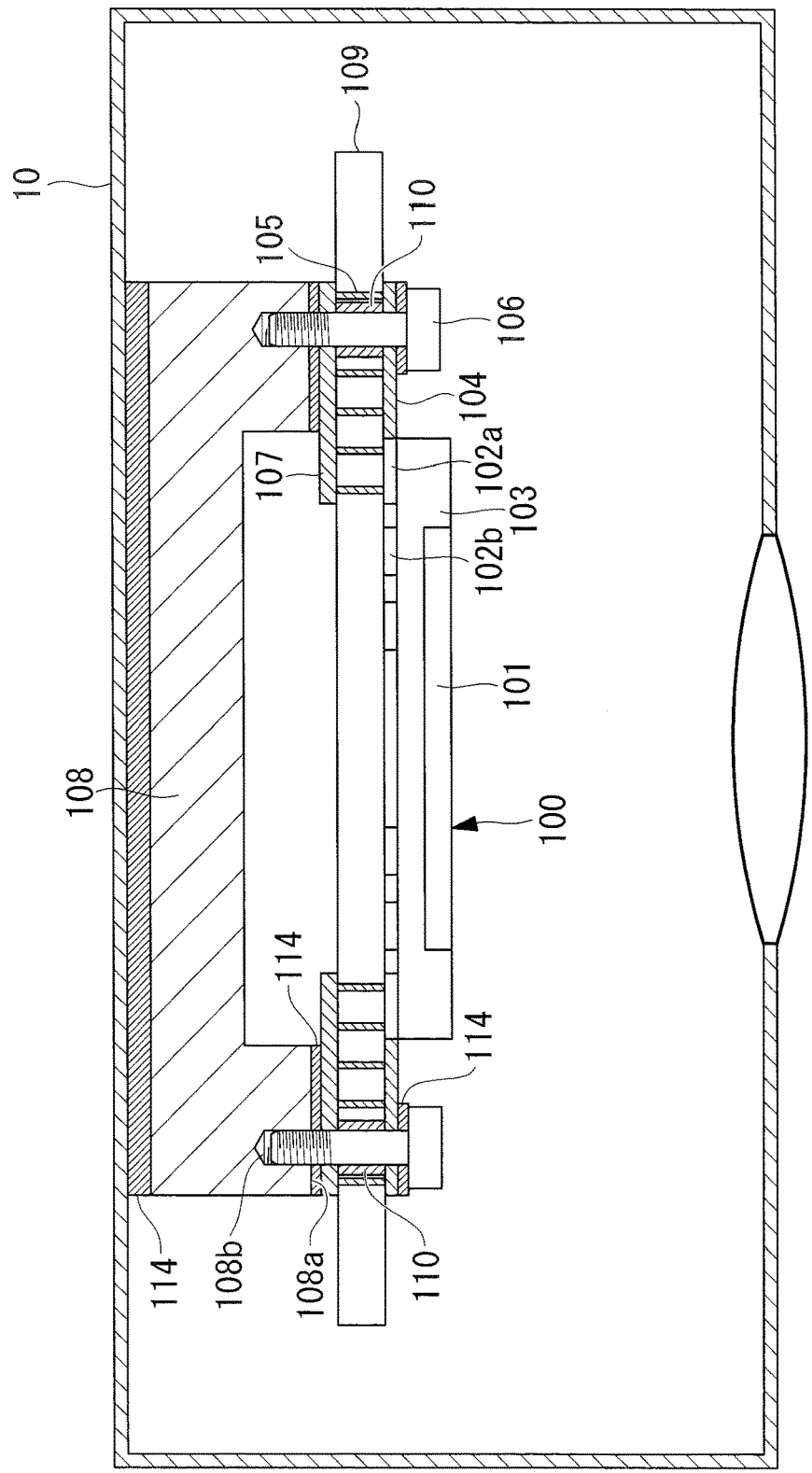
FIG. 1 is a drawing which shows a configuration of a cooling-type imaging device according to a first embodiment of the present invention.
Figure 2:
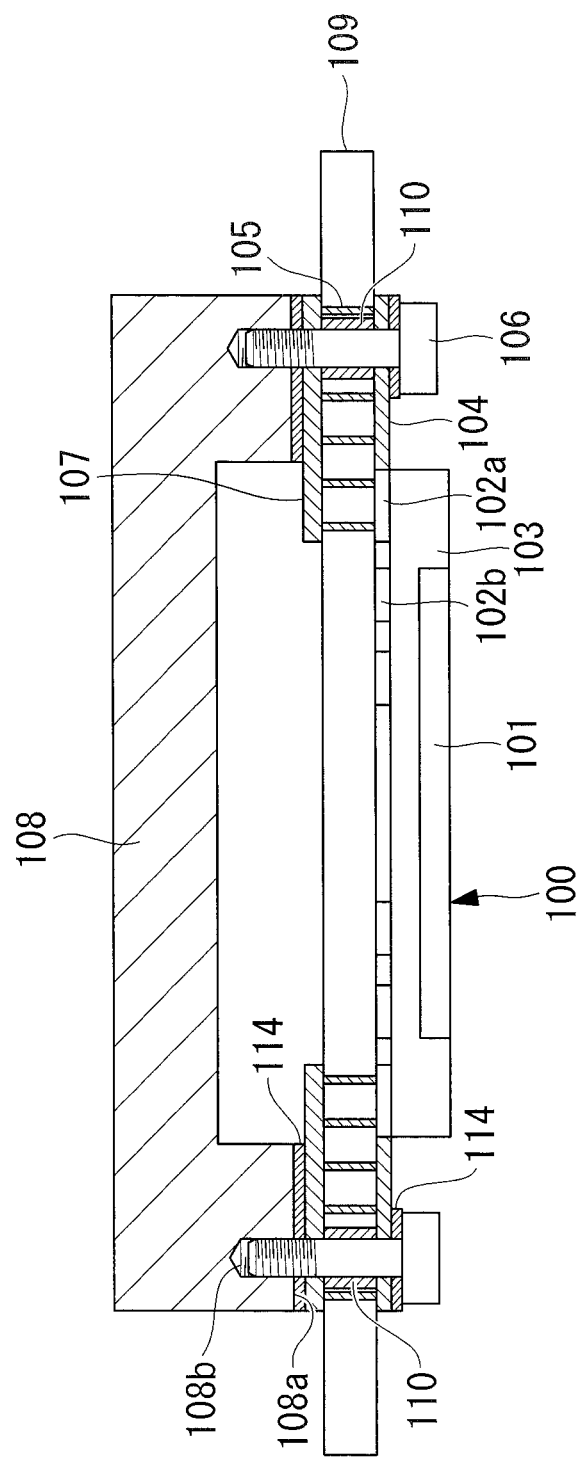
FIG. 2 is a drawing which shows the configuration of the cooling-type imaging device according to the first embodiment of the present invention.

As shown in FIGS. 1 and 2, the cooling-type imaging device has a cooling unit 108 as a cooling member, a printed circuit board 109, and an imaging element 100. The cooling unit 108 is attached to the back surface of the imaging element 100 via the printed circuit board 109 and accommodated in a housing heat radiation mechanism 100.

Figure 3:
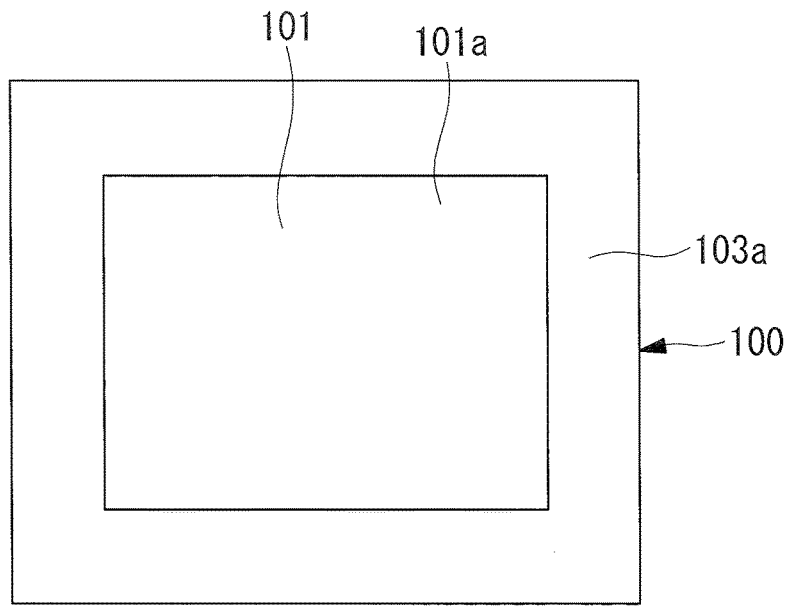
FIG. 3 is a schematic front view of an imaging element employed in the cooling-type imaging device according to the first embodiment of the present invention.
Figure 4:
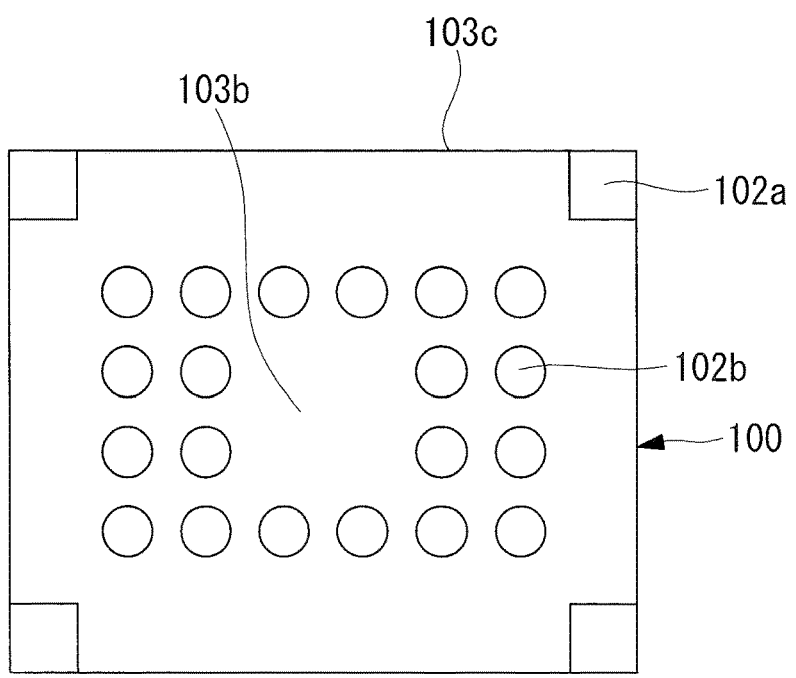
FIG. 4 is a schematic back view of the imaging element employed in the cooling-type imaging device according to the first embodiment of the present invention.
Figure 5:
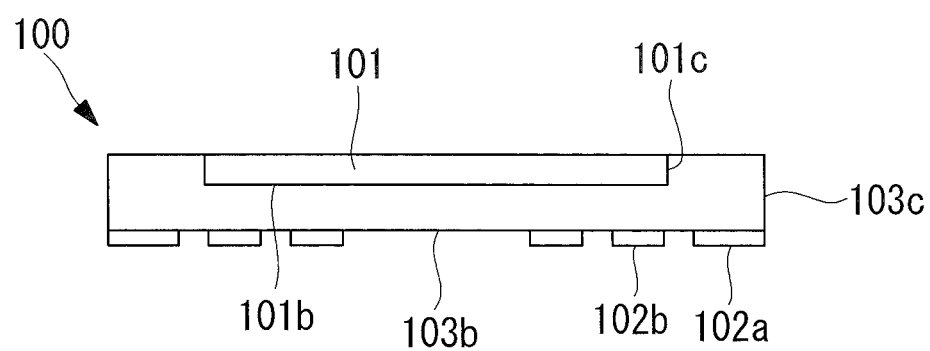
FIG. 5 is a schematic side view of the imaging element employed in the cooling-type imaging device according to the first embodiment of the present invention.

As shown in FIGS. 3-5, the imaging element 100 has a rectangular parallelepiped shape, and also has an imaging element main body 101 and an external cover 103. In the imaging element main body 101, the main body front surface 101a thereof, which has a light-incident surface, is exposed, and the main body back surface 101b and the main body side surface 101c are covered by the external cover 103.

As shown in FIG. 4, the back surface of the imaging element 100 has the unconnected external pins 102a each of which is provided at the periphery (at each of the four corners in this embodiment) thereof, which are not connected to the imaging element main body 101, and which are for fixing the imaging element 100 to the printed circuit board 109, and the plurality of external pins 102b each of which is connected to the imaging element main body 101 and each of which is provided at a center side position of the imaging element main body 101, that is, a corresponding position of the imaging element main body 101. In other words, the back surface of the imaging element 100 is provided with the unconnected external pins 102a which are terminals for fixation and not connected to the internal wiring of the imaging element 100, and the external pins 102b which are signal terminals and connected to the internal wiring of the imaging element 100.

The unconnected external pins 102a and the external pins 102b are exposed to the outside of the imaging element through the back surface of the external cover 103, and the unconnected external pins 102a and the external pins 102b are connected to a copper foil pattern configured on the printed circuit board 109 when the imaging element is mounted on the printed circuit board 109.

The external cover 103 has a front side cover 103a which covers the periphery of the main body front surface 101a of the imaging element main body 101, a back side cover 103b which covers the main body back surface 101b of the imaging element main body 101, and a side cover 103c which covers the main body side surface 101c of imaging element main body 101. In this embodiment, the back side cover 103b exists at the area where the unconnected external pins 102a and the external pins 102b of the main body back surface 101b of the imaging element main body 101 are not disposed. Also, as shown in the side view of the imaging element 100 in FIG. 5, the imaging element 100 employed in the cooling-type imaging device of this embodiment does not have a pin which penetrates the printed circuit board. Therefore, the imaging element can be said as a surface mounted type imaging element which is mounted on the surface of the printed circuit board 109.

Further, as shown in FIGS. 1 and 2, the imaging element 100 is mounted on the printed circuit board 109 by soldering, using the external pins 102b. At this stage, each of the external pins 102a is mounted on the front-surface-side copper foil pattern 104 which is configured on the periphery (the four corners in this embodiment) of the surface of the printed circuit board 109. The copper foil pattern 104 provided on the printed circuit board 109 has a larger area than a contact area in which the copper foil pattern has contact with the unconnected external pin 102a.

Figure 6:
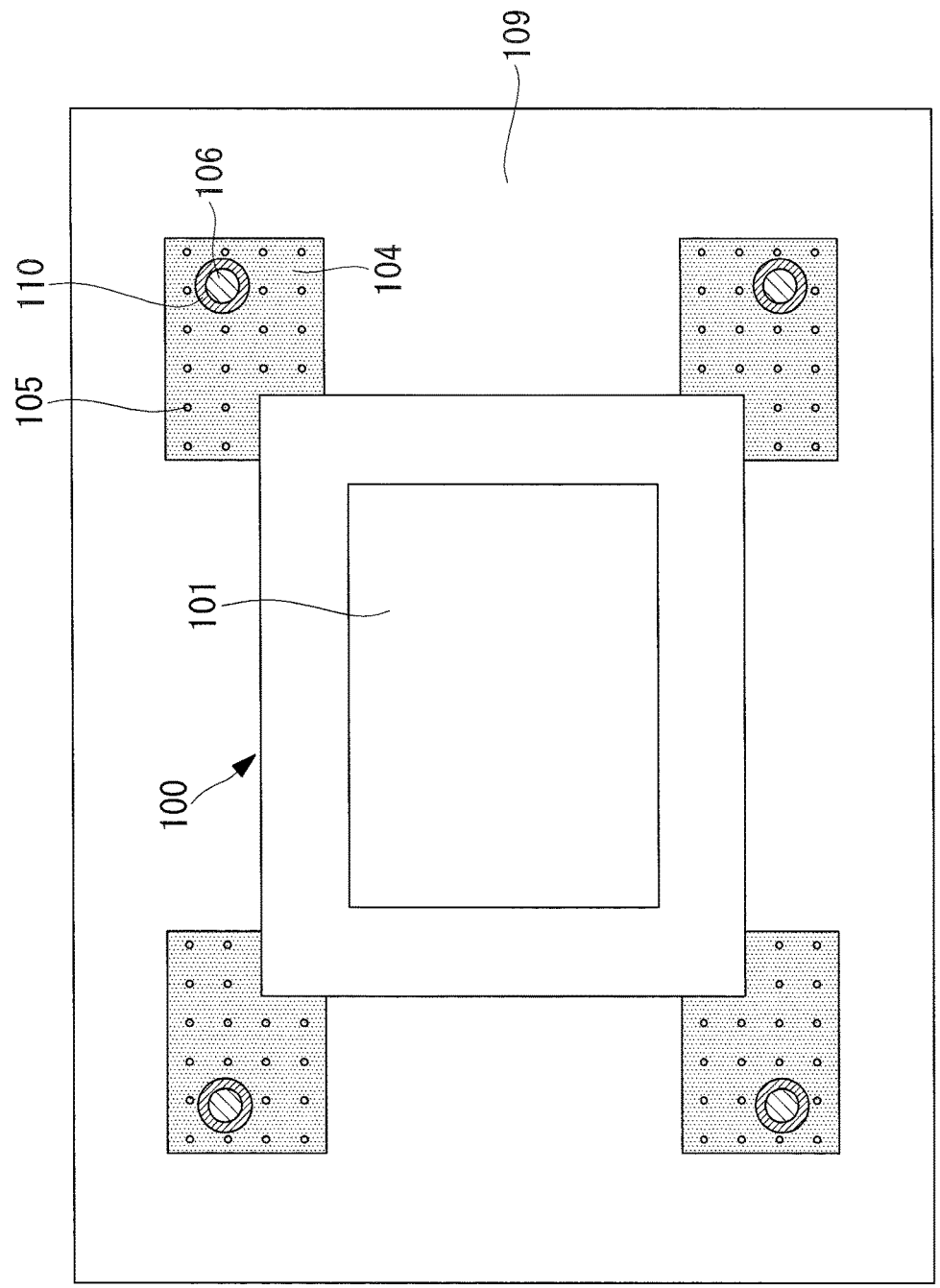
FIG. 6 is a schematic front view of a printed circuit board employed in the cooling-type imaging device according to the first embodiment of the present invention.

Specifically, as shown in FIG. 6, the printed circuit board 109 is provided with the rectangular copper foil patterns 104 (for patterns in this embodiment) at the positions corresponding to the unconnected external pins 102a of the imaging element 100 on the surface of the printed circuit board 109. Each of the copper foil patterns 104 has a through-hole via 105 for electrically connecting various kinds of parts which are mounted on the printed circuit board 109, and through holes 110 for mounting the screws 106 as fixing portions. Each of the copper foil patterns 104 has an exposure area which is located at an outside area relative to the periphery of the imaging element 100, that is the periphery of the external cover 103, when the imaging element 100 is mounted on the printed circuit board 109. Further, the through hole 110 is located in the exposure area, and therefore the through hole 110 is exposed in the situation in which the imaging element 100 has been mounted. The bolts 106 inserted into the through holes 110 are made of a high thermal conductivity material, such as metal.

Figure 7:
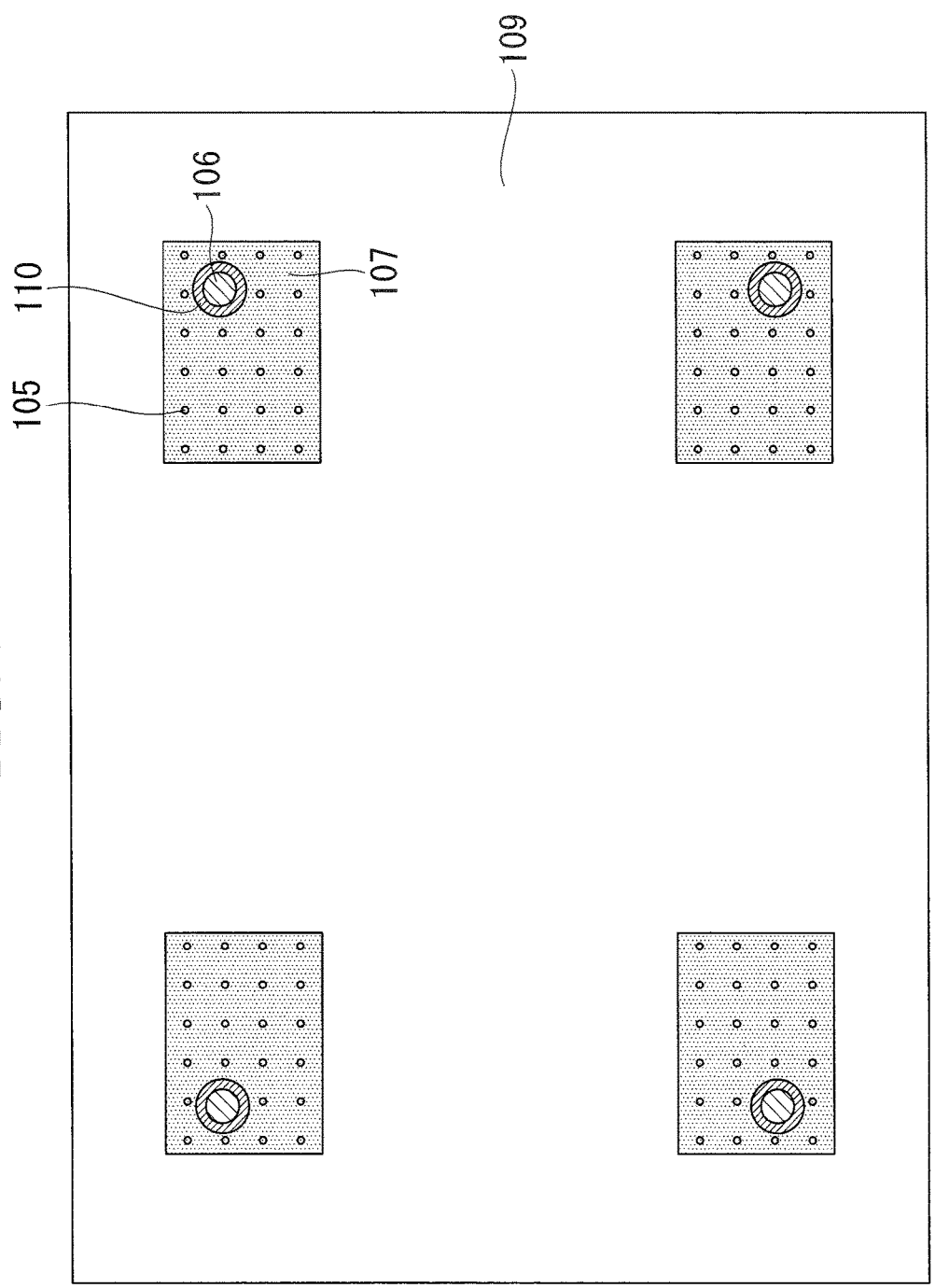
FIG. 7 is a schematic back view of the printed circuit board employed in the cooling-type imaging device according to the first embodiment of the present invention.

As shown in FIG. 7, the back surface of the printed circuit board 109 is provided with the back-surface-side copper foil patterns 107 (four patterns in this embodiment) which correspond to the front-surface-side copper foil patterns 104. In the printed circuit board 109, the circuit board 109 side of each of the copper foil patterns 104 is connected to the circuit board 109 side of each of the copper foil patterns 107 through the through-hole vias 105 at two or more positions.

Figure 8:
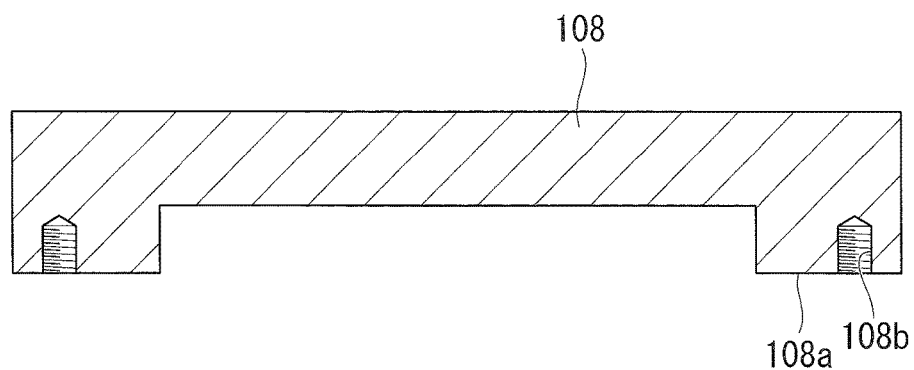
FIG. 8 is a schematic side view of a cooling unit employed in the cooling-type imaging device according to the first embodiment of the present invention.
Figure 9:
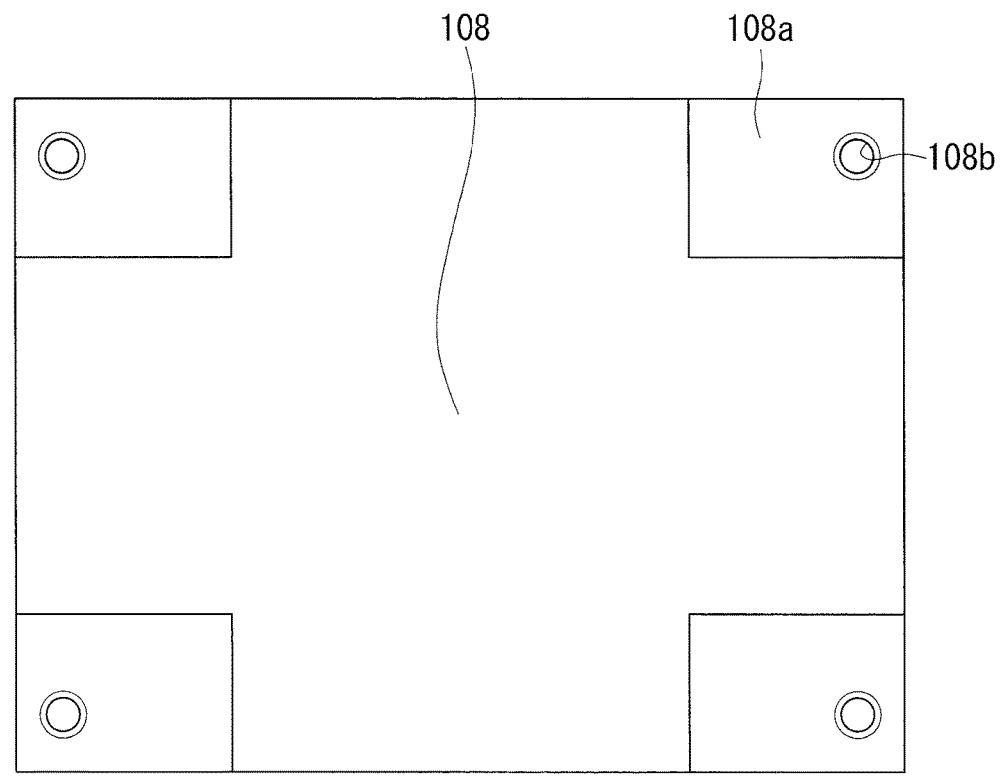
FIG. 9 is a schematic back view of the cooling unit employed in the cooling-type imaging device according to the first embodiment of the present invention.

As shown in FIGS. 8 and 9, the cooling unit 108 has, for example, four legs protruding from one surface of the rectangular parallelepiped shape at the four corners, and the cooling unit can be made of a metal member as a heat sink or a Peltier element. The cooling unit 108 has copper-foil-pattern contact surfaces 108a, and screw holes 108b provided at positions corresponding to the through holes 110. The copper-foil-pattern contact surfaces 108a are connected to the copper foil patterns 107 via the heat transfer promoting member 114, such as heat transfer grease. The cooling unit 108 is fixed to the printed circuit board 109 by screwing the bolts 106 into the screw holes 108b.

The cooling unit 108 has contact with the housing heat radiation mechanism 10 via the heat transfer promoting member 114, and the housing heat radiation mechanism 10 is hermetically closed. By the way, the Peltier element, which is a component of the cooling unit 108, is a plate-shaped semiconductor element utilizing the Peltier effect and, when current is applied to the element, the one surface thereof absorbs heat, and the other surface thereof generates heat. Therefore, the heat absorbing surface is connected to the back-surface-side copper foil patterns 107, and the heat generating surface is connected to the housing heat radiation mechanism 10.

Next, a function of the cooling-type imaging device will be described below.

When the electric source of the cooling-type imaging device is turned on, the imaging element becomes an operating state by an operating portion or data stored in a set data storing portion, which are not shown in the drawings, in the cooling-type imaging device. When the imaging element 100 is in an operating state, the imaging element acquires image data, outputs the image data to an outputting device such as a display portion after predetermined image processing is performed by an image processing portion, and thereby the image data is output (displayed).

In the aforementioned operation, the imaging element 100 generates heat, and then the cooling unit 108 starts to absorb heat the heat generated in the imaging element 100. At this stage, the heat generated in the imaging element main body 101 moves from a high temperature portion to a low temperature portion through three phenomena including heat conduction, heat transfer, and heat radiation. The heat radiation paths of the imaging element main body 100 has a path (heat conduction) which conducts heat from the imaging element main body 101 to the circuit board through the external elements 102b, and a path (heat transfer, heat radiation) which radiates heat from the surface to the air. The heat moves through portions whose thermal resistance is small. The thermal resistance is obtained by the following expression.

$$\theta[° C./W] = \frac{L}{K \cdot W \cdot t}$$ (Expression 1)

In the expression, θ is heat resistance [° C./W], L is length [mm], K is thermal conductivity [S/(mm·K], W is width [mm], t is thickness [mm].

According to Expression 1, the thermal resistance becomes small when the length is short and the thermal conductivity, the width, and the thickness (which is equivalent to the area) is large.

The following Table 1 shows thermal conductivities of materials which can be used in the cooling-type imaging device.

TABLE 1

| Name of Substance | Thermal Conductivity [W/m · K] |
|---|---|
| Copper | 403 |
| Aluminum | 236 |
| Epoxy (FR4) | 0.25 |
| Solder | 39 |
| Air | 0.024 |
| Heat Transfer Promoting Member (G-775, Shin-Etsu Chemical Co., Ltd.) | 3.6 |
| Heat Transfer Promoting Member (5880H, 3M Company) | 3.0 |

As shown in Table 1 shows that thermal conductivities of metals, such as copper, aluminum, solder, and the like, are high, and that those of epoxy and air are low. Therefore, as the heat radiation path of the imaging element 100, the path through the printed circuit board 109 is dominant from the aspect of the thermal conductivity, the surface area of the parts, and the gas circulation of the air in the closed space. This is because the heat resistance between the terminals (the unconnected external pins 102a, the external pins 102b) and the printed circuit board 109 is much smaller than the heat resistance between the external cover 103 and the air.

The thermal resistances of copper and epoxy, which are the main materials of the materials which compose the printed circuit board 109 as a dominant heat radiation path for the imaging element 100, are shown below.

Copper

Lateral direction (the thickness is 0.035 mm): 79 [° C./W]

Thickness direction (the thickness is 0.035 mm (2.54 cm^2)): 0.00015 [° C./W]

One through hole via (the diameter is 0.5 mm, the height 1.5 mm): 100 [° C./W]

N through hole vias: 100/N [° C./W]

Epoxy (FR4)

Lateral direction (the thickness is 1.5 mm): 2699 [° C./W]

Thickness direction (the thickness is 1.5 mm (2.54 cm^2)): 9.3 [° C./W]

Thus, copper is superior to epoxy when heat is transferred toward the lateral direction along the surface of the printed circuit board 109. Also, when heat is transferred toward the thickness direction of the circuit board, it is possible to reduce the thermal resistance and to improve the thermal conductivity by allowing the heat to go through the epoxy (FR4) and by providing a plurality of through hole vias in the copper foil patterns.

Since the sizes of normal copper foil patterns are the same as or similar to that of the unconnected external pins 102a, the area of the epoxy is larger, and therefore the heat transfer in the lateral direction of the printed circuit board 109 cannot be expected. In the thickness direction of the printed circuit board 109, the thermal conductivity becomes small by providing a plurality of through hole vias and making the heat go through the epoxy (FP4), but it is still inferior to materials, such as metals, which has superior thermal conductivities.

In this embodiment, in order to improve the thermal conductivity in the lateral direction of the printed circuit board 109 regarding the unconnected external pins 102a of the imaging element 100, the copper foil patterns 104 and the copper foil patterns 107, which have superior thermal conductivities, are configured to extend to an outside area relative to the mounted surface of the imaging element 100. Further, in order to improve the thermal conductivity in the thickness direction of the printed circuit board 109, the copper foil pattern 104 and the copper foil pattern 107 are connected in the printed circuit board 109 by the plurality of through hole vias 105, and the bolts 106, which are made of material having superior thermal conductivity and which function as fixing portions, are installed so as to penetrate the through holes 110 provided in the copper foil patterns 104 and 107.

Since the bolts 106 are made of material whose thermal conductivity is higher than those of copper, aluminum, epoxy, and the like in the aforementioned Table 1, and therefore the thermal resistance is small, the thermal conductivity through the bolts is also performed. Therefore, the thermal resistance between the imaging element 100, which generates heat and which is mounted on the printed circuit board 109, and the copper foil patterns 107, which has contact with the cooling unit 108 for absorbing heat, becomes small.

Since the cooling unit 108 is connected to the copper foil patterns 107 with a superior surface condition by using the heat transfer promoting member 114 and using the bolts 106, the heat resistance between the imaging element 100 and the cooling unit 108 becomes small, and therefore it is possible to cool the imaging element 100.

The heat absorbed by the cooling unit 108 is radiated through the housing heat radiation mechanism 10 which has contact with the heat dissipation surface of the cooling unit 108 through the heat transfer promoting member 114. The housing heat radiation mechanism 10 has a sufficient surface area to radiate heat into the outside air.

As described above, it is possible to effectively cool with a simple configuration, and also it is possible to have images with superior SN ratios, by reducing the thermal resistance between the cooling unit 108 and the imaging element 100, and by cooling the imaging element 100 by the cooling unit 108.

Second Embodiment

The cooling-type imaging device of this embodiment has a configuration similar to that of the aforementioned first embodiment. The cooling-type imaging device of this embodiment does not have the printed circuit board 109, but has a printed circuit board 112 which has an opening portion 118, does not have the cooling unit 108, but has a protruding type cooling unit 111 having a protruding portion 111c. Therefore, this embodiment is configured to achieve the cooling function by making the protruding type cooling unit 111 directly touch or connect with the imaging element 100, not making the heat go through the printed circuit board 112.

In the cooling-type imaging device of this embodiment, the elements which are the same as those of the first embodiment are accompanied with the same reference signs, and the explanations for those elements are omitted. Further, the cooling-type imaging device of this embodiment is accommodated in a housing heat radiation mechanism, whose explanation is omitted. Only the differences between this embodiment and the first embodiment will be described below.

Figure 10:
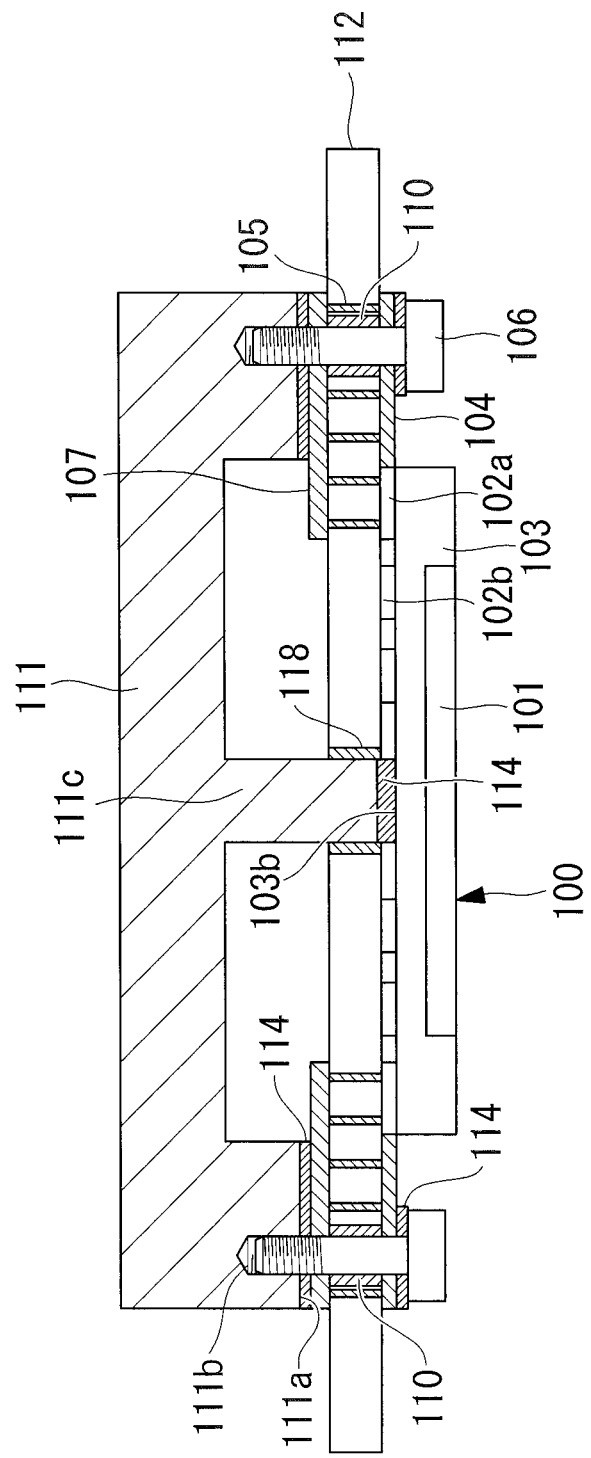
FIG. 10 is a drawing which shows a configuration of a cooling-type imaging device according to a second embodiment of the present invention.
Figure 11:
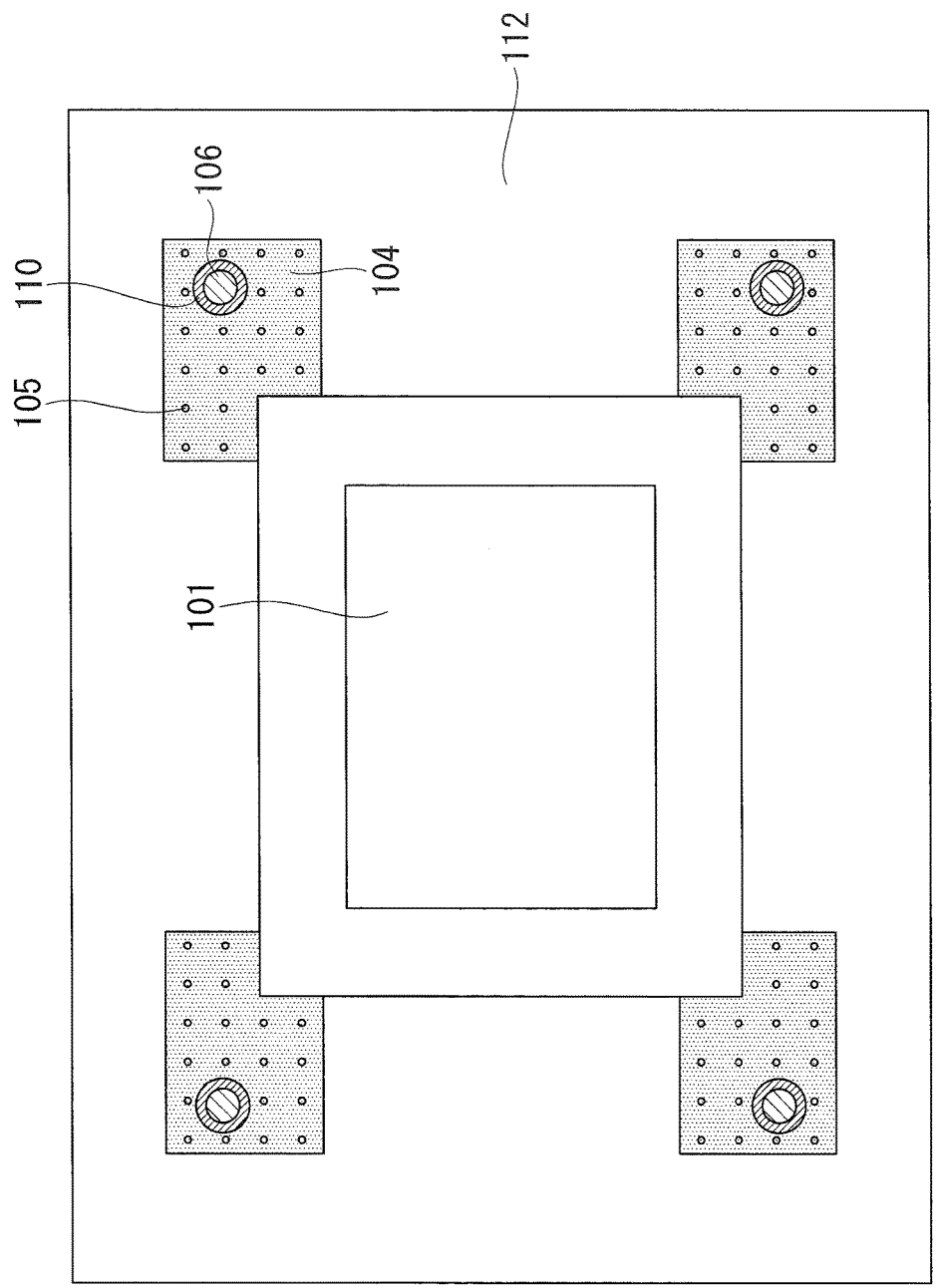
FIG. 11 is a schematic front view of a printed circuit board employed in the cooling-type imaging device according to the second embodiment of the present invention.
Figure 12:
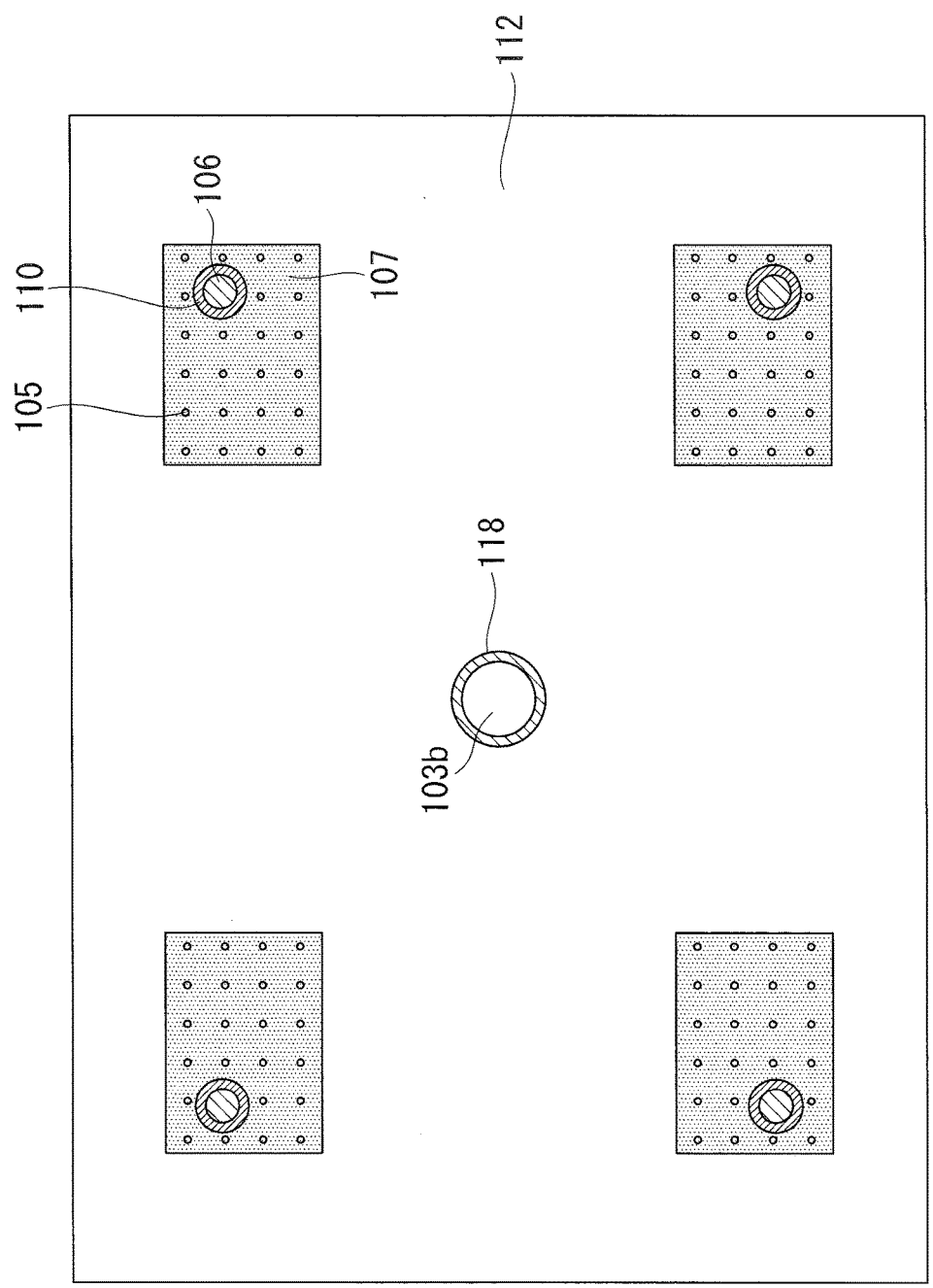
FIG. 12 is a schematic back view of the printed circuit board employed in the cooling-type imaging device according to the second embodiment of the present invention.

As shown in FIGS. 10-12, the printed circuit board 112 is provided with the opening 112 at the center of the printed circuit board 112. Further, the protruding type cooling unit 111 is provided with the protruding portion 111c at a position which corresponds to the opening position 118. Therefore, it is possible to make the protruding type cooling unit 111 touch or connect with the imaging element 100 to cool the imaging element 100, without making the heat go through the printed circuit board 112.

The tips of the unconnected external pins 102a and the external pins 102b, which are arranged in a lattice pattern and which are connected to the imaging element main body 101 in the imaging element 100, are exposed from the back surface of the imaging element 100, that is the back surface of the back side cover 103b. Specifically, an area located in the back surface of the imaging element 100 and at the center side thereof is not provided with the external pins 102b, and the area is located at a position corresponding to the opening portion 118 of the printed circuit board 112. Therefore, as shown in FIG. 12, when the back surface of the printed circuit board 112 is viewed from the front in a state in which the imaging element 100 is mounted on the printed circuit board 112, the back side cover 103b of the imaging element 100 is exposed from the opening portion 118 of the printed circuit board 112.

Figure 13:
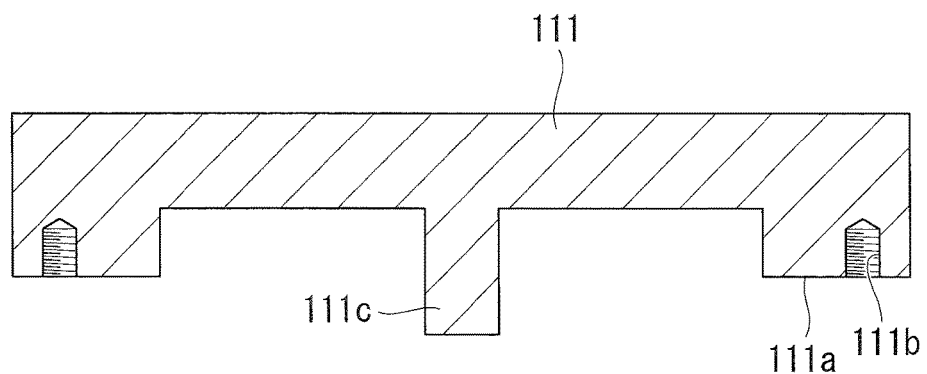
FIG. 13 is a schematic side view of a cooling unit employed in the cooling-type imaging device according to the second embodiment of the present invention.
Figure 14:
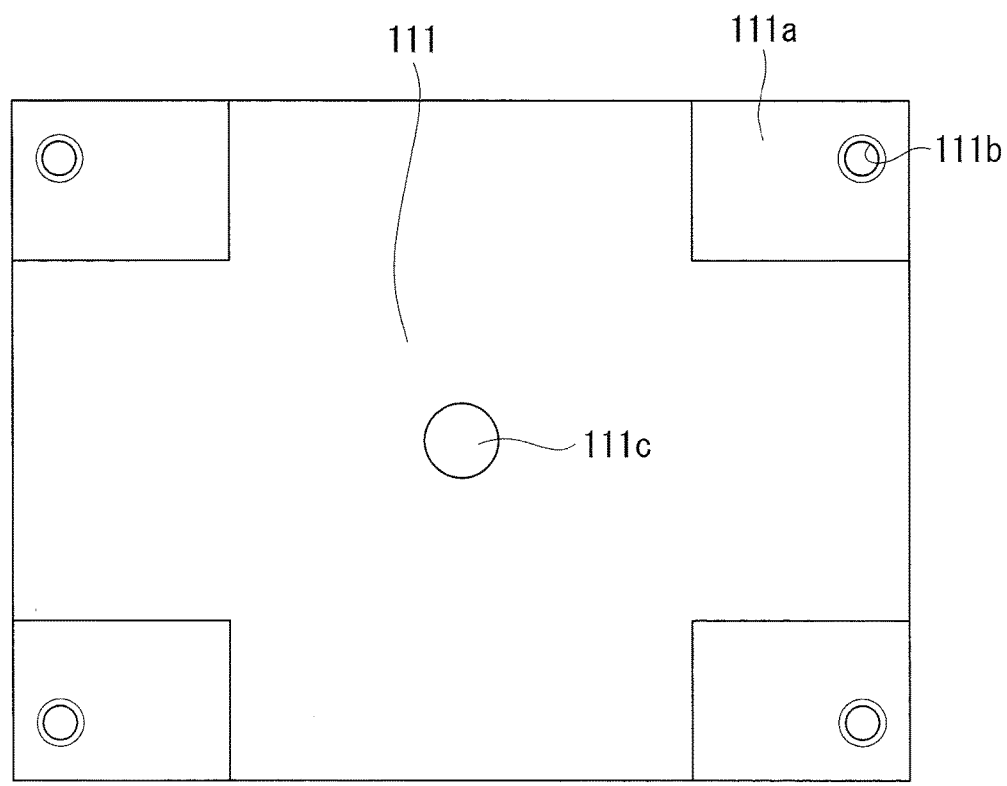
FIG. 14 is a schematic back view of the cooling unit employed in the cooling-type imaging device according to the second embodiment of the present invention.

In FIGS. 10, 13, and 14, the protruding portion 111c of the protruding type cooling unit 111 is provided at a position which faces the opening portion 118 of the printed circuit board 112. When the protruding type cooling unit 111 is attached to the printed circuit board 112 by the bolts 106, the tip of the protruding portion 111c penetrates the opening portion 118 of the printed circuit board 112, and the tip directly touches or connects with the back side cover 103b of the imaging element 100. In this configuration, there is a possibility that the protruding portion 111c does not have contact with the back side cover 103b of the imaging element 100 depending on the accuracy of the parts or the degree of tightening the bolts 106. Also, there is a possibility that the soldered portions are delaminated with the external pins 102b near the back side cover 103b of the imaging element 100 by a situation in which stress is caused by making the protruding portion 111c contact with the back side cover 103b with a large force.

Therefore, in the protruding type cooling unit 111, the protruding portion 111c is configured so that the protruding portion 111c is higher than the copper-foil-pattern contact surface 111a, and that the height difference between the protruding portion 111c and the copper-foil-pattern contact surface 111a is accurately formed to be smaller than the thickness of the printed circuit board 112. A small gap between the protruding portion 111c and the back side cover 103b is formed by making the height difference between the protruding portion 111c and the copper-foil-pattern contact surface 111a smaller than the thickness of the printed circuit board 112. The delamination of the soldered portions is prevented and non-contact situation is prevented by filling the heat transfer promoting member 114 into the gap. Therefore, heat conduction is reliably performed, securing the heat conduction path.

In this embodiment, it is possible to make the thermal resistance small by a configuration in which the external cover 103 and the protruding type cooling unit 111 have contact via the heat transfer promoting member 114. Especially, when compared with the thermal resistance between the other portions of the imaging element external cover 103, which are unable to have direct contact with the cooling unit, and the air, the thermal resistance between the external cover 103 and the protruding type cooling unit 111 dramatically becomes small. By adding portions whose thermal resistances are small, the heat dissipation path is not limited to the copper foil pattern described in the first embodiment. Since the path is extended by using the contact portion of the protruding type cooling unit 111 of the present embodiment, the cooling of the imaging element 100 can be performed more efficiently.

As described above, the thermal resistance between the protruding type cooling unit 111 and the imaging element 100 is made small by providing the protruding portion 111c in the protruding type cooling unit 111. Therefore, it is possible to effectively cool with a simple configuration, and also it is possible to acquire images with superior SN ratios, by cooling the imaging element 100 using the protruding type cooling unit 111.

Third Embodiment

The cooling-type imaging device of the third embodiment has a heat radiating member 117. The heat radiating member 117 has contact with the imaging element 100 via the copper foil patterns 104 or the heat transfer promoting member 118, and the heat radiating member 117 is fixed by the bolts 106 and cools the imaging element 100. In this embodiment, the elements which are the same as those of the first and second embodiments are accompanied with the same reference signs, and the explanations for those elements are omitted.

Figure 15:
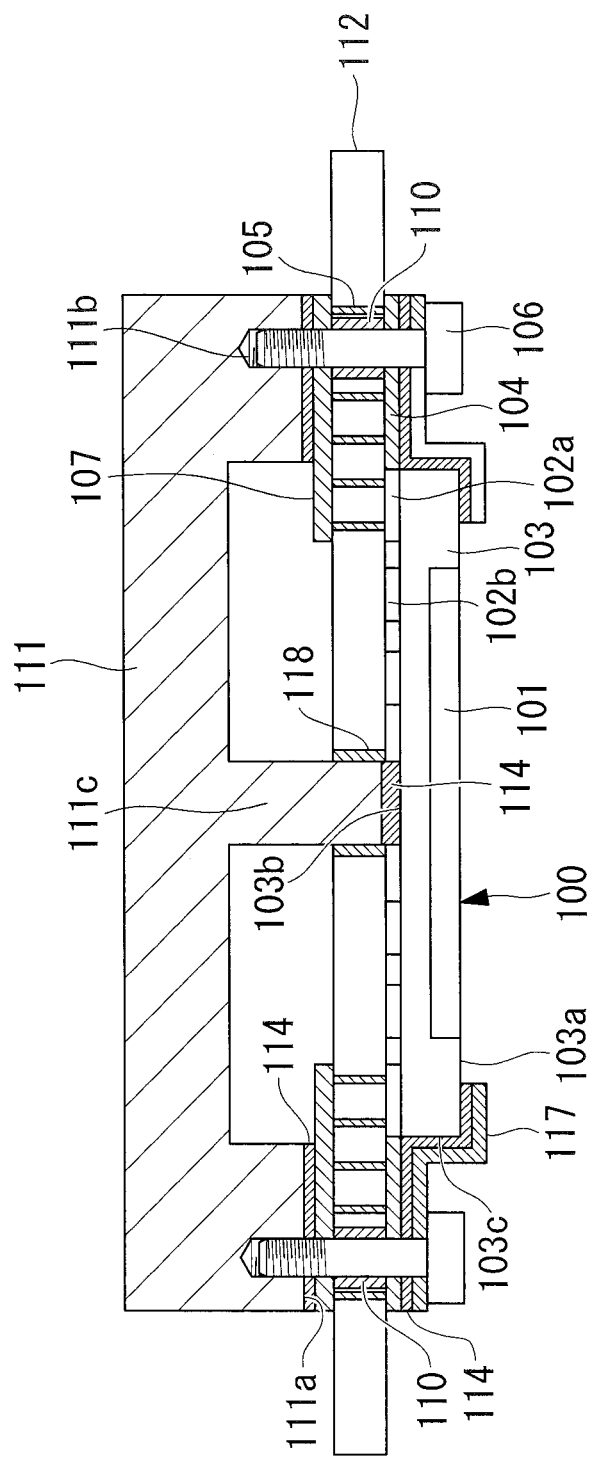
FIG. 15 is a drawing which shows a configuration of a cooling-type imaging device according to a third embodiment of the present invention.
Figure 16:
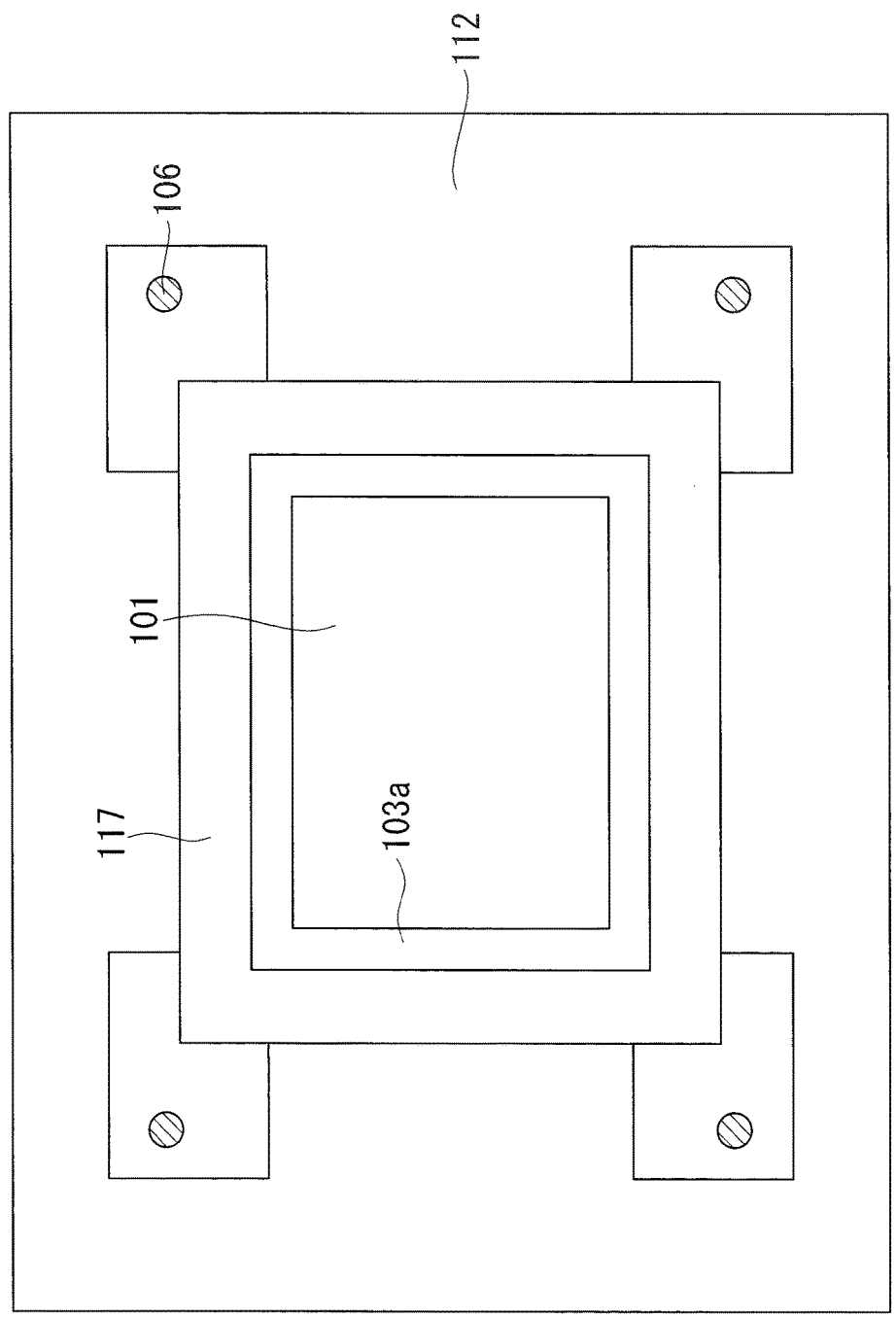
FIG. 16 is a schematic front view of a printed circuit board employed in the cooling-type imaging device according to the third embodiment of the present invention.
Figure 17:
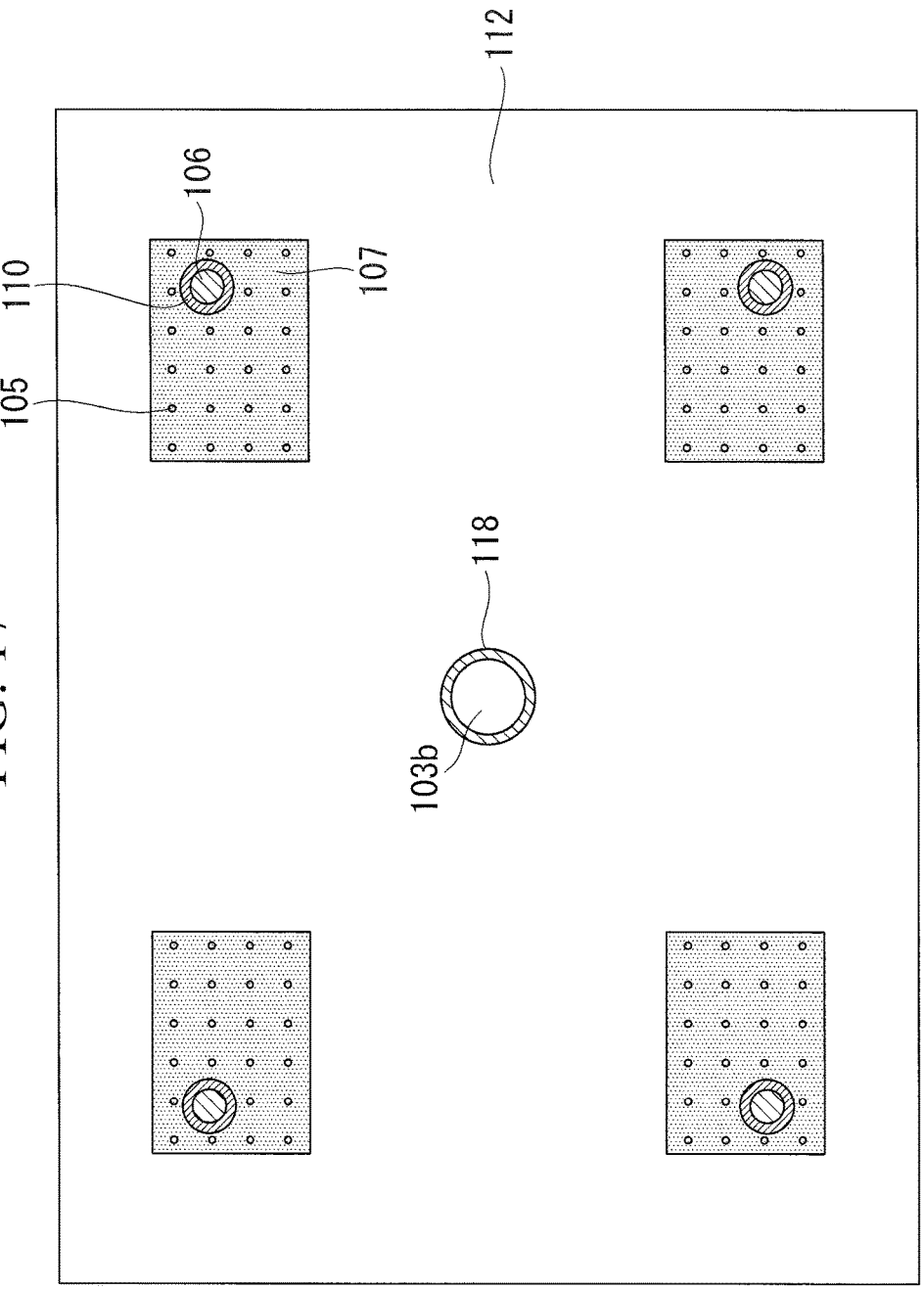
FIG. 17 is a schematic back view of the printed circuit board employed in the cooling-type imaging device according to the third embodiment of the present invention.

As shown in FIGS. 15-17, the imaging element 100 of this embodiment has a rectangular parallelepiped shape, the main body front surface 101a, which has a light-incident surface, the main body back surface 101b, and the main body side surface 101c are covered and protected by the external cover 103. In order to disperse the heat generated in the imaging element 100, the heat radiating member 117 is located so that the heat radiating member 117 covers and contacts with the front side cover 103a and the side cover 103c.

The heat radiating member 117 is located such that the heat radiating member 117 covers the external cover 103, that the contact area between the heat radiating member 117 and the imaging element 100 is large as much as possible, and that the heat radiating member 117 does not cover the light-incident surface of the main body front surface 101a of the imaging element 100. Also, the heat radiating member 117 is located so as to cover the copper foil patterns 104. Further, the gap between the heat radiating member 117 and the imaging element 100 is provided with the heat transfer promoting member 114. Therefore, the heat radiating member 117 has indirect contact with the caper foil patterns 104 via the heat transfer promoting member 114, and fixed by the bolts 106.

As described above, the protruding type cooling unit 111 directly touches or connect with the external cover 103 through the protruding portion 111c, and touches or connects with the heat radiating member 117 through the heat transfer promoting member 114 and the bolts 106, which leads to a configuration in which the contact area between the protruding type cooling unit 111 and the imaging element 100 becomes large relative to those of the other embodiments described above.

In other words, by utilizing the front side cover 103a and the side cover 103c as heat radiating paths using heat conduction as well as the back side cover 103b, it becomes possible to form a plurality of heat dissipation paths using heat conduction for the imaging element 100, and therefore it becomes possible to cool the imaging element 100 in a more efficient way. Therefore, it is possible to acquire images with superior SN ratios by reducing the thermal resistance between the protruding type cooling unit 111 and the imaging element 100 and by cooling the imaging element 100 using the protruding type cooling unit 111.

Figure 18:
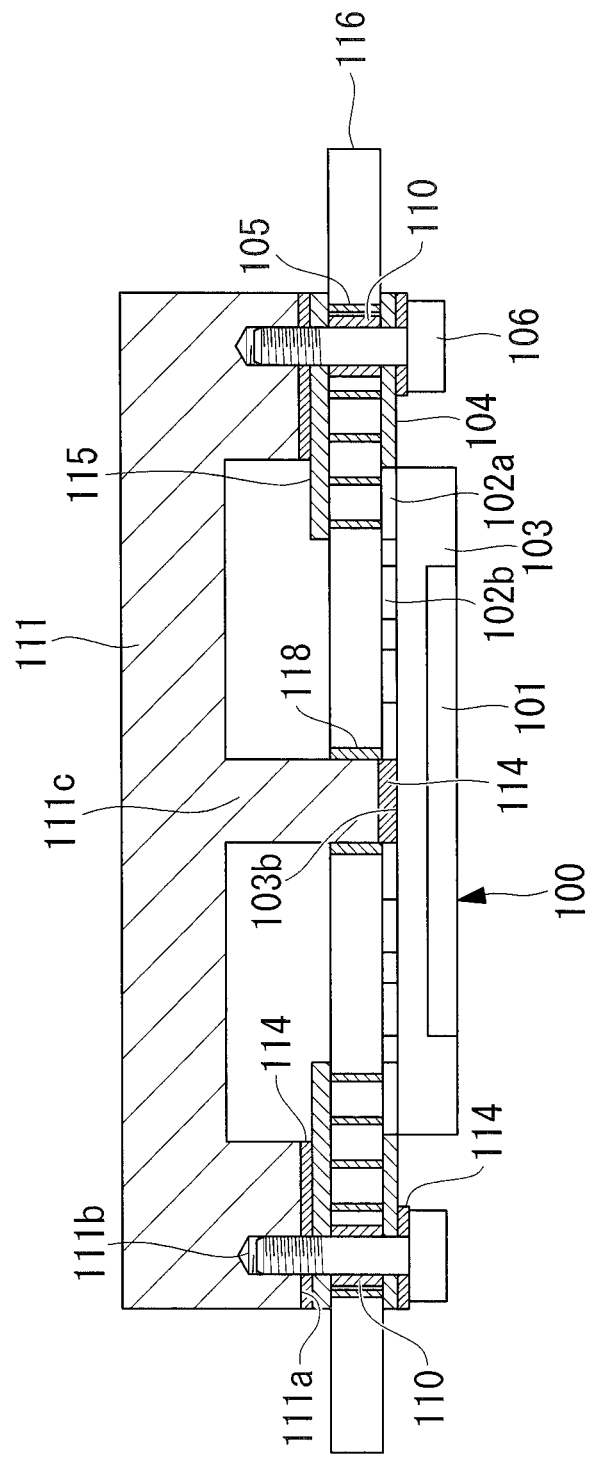
FIG. 18 is a drawing which shows a configuration of a cooling-type imaging device according to a modified example of the third embodiment of the present invention.
Figure 19:
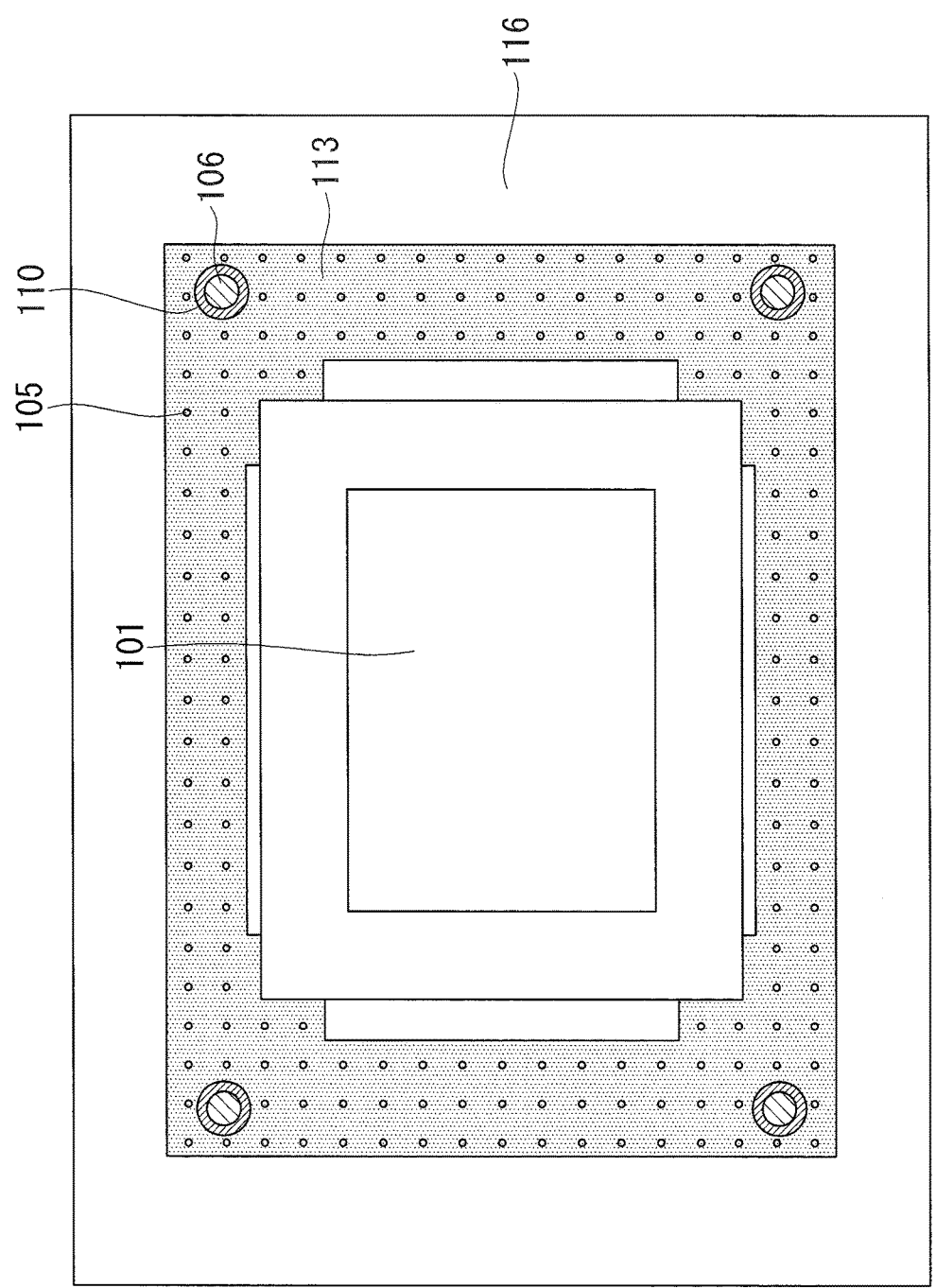
FIG. 19 is a schematic front view of a printed circuit board employed in the cooling-type imaging device according to the modified example of the third embodiment of the present invention.
Figure 20:
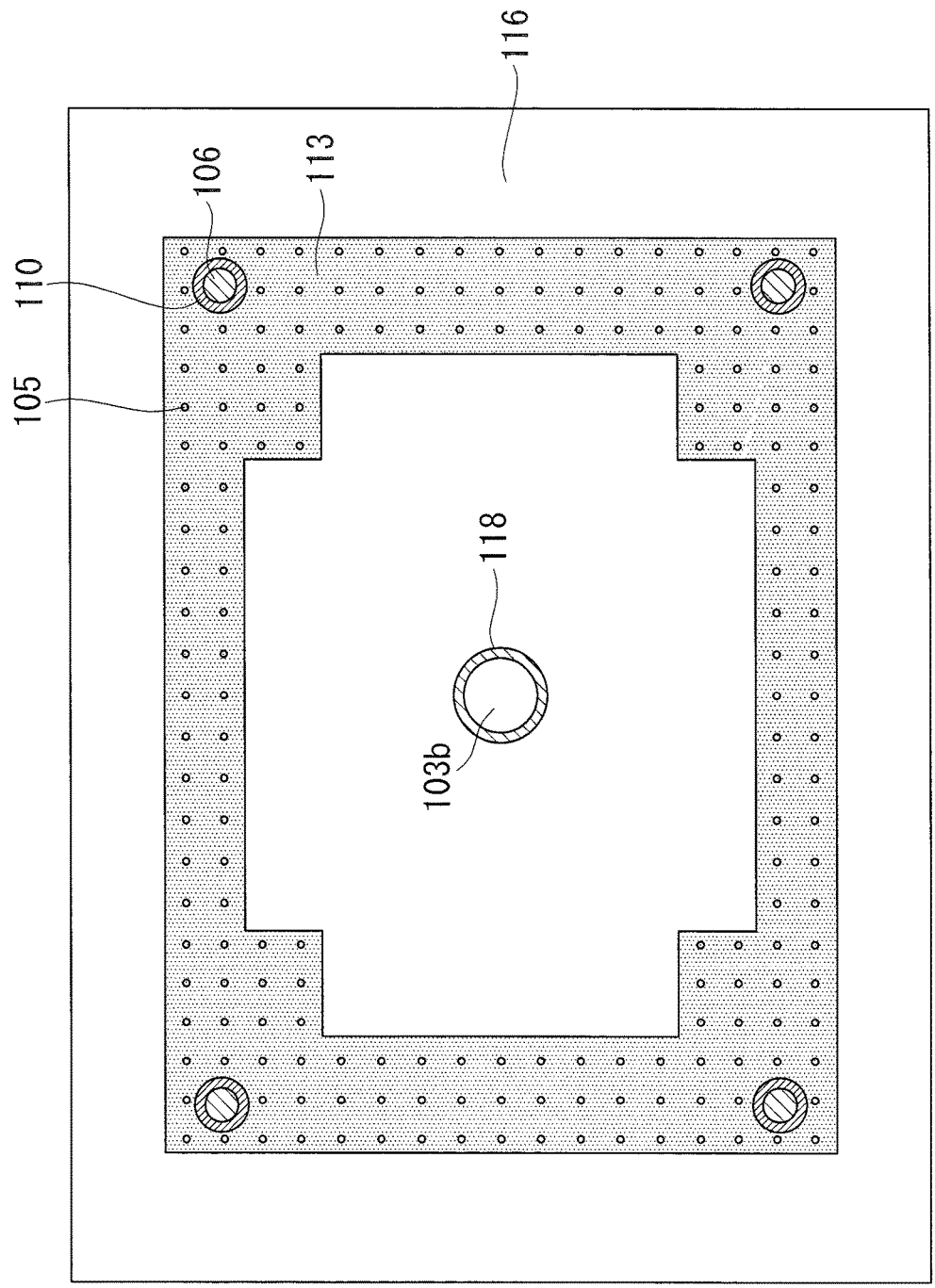
FIG. 20 is a schematic front view of the printed circuit board employed in the cooling-type imaging device according to the modified example of the third embodiment of the present invention.

Note that the opening portion 118 of the printed circuit board can be a through hole in order to improve the heat conduction. The copper foil patterns 107 for heat dissipation is not limited to the ones described above, and can be the one which is configured so as to surround the imaging element 100 and have as large an area as possible as shown in FIGS. 18-20.

The gap is formed between the cooling unit and the printed circuit board in each embodiment as shown in FIGS. 2, 10, 15, and 18, which should not be considered as the only configuration. The gap can be filled with the heat transfer promoting member 114.

By filing the heat transfer promoting member 114 between the cooling unit and the printed circuit board, the heat conduction is improved relative to the air, and the imaging element 100 can be cooled in a more effective way.

An aspect of the present invention which includes the aforementioned embodiments is a cooling mechanism for a surface-mounted-type photoelectric conversion element which has a signal terminal and a terminal for fixation at a back surface thereof, wherein the signal terminal is connected to internal wiring and the terminal for fixation is not connected to the internal wiring, the cooling mechanism comprising the following elements: a front-surface-side copper foil pattern which is provided on a front surface of a circuit board and to which the terminal for fixation is connected, the front surface being located at one side in the thickness direction of the circuit board; a back-surface-side copper foil pattern which is provided on a back surface of the circuit board, the back surface being located at the other side in the thickness direction of the circuit board; a through-hole via which connects the front-surface-side copper foil pattern and the back-surface-side copper foil pattern; and a cooling member which is fixed to the circuit board so as to have contact with the back-surface-side copper foil pattern, and which cools the back-surface-side copper foil pattern.

According to this aspect, the photoelectric conversion element is mounted on the circuit board by connecting the terminal for fixation to the front-surface-side copper foil pattern, and the circuit board has the front-surface-side copper foil pattern and the back-surface-side copper foil pattern, both of which are connected to the through hole via. Further, the cooling member has contact with the back-surface-side copper foil pattern provided at the back surface side of the circuit board. In this configuration, the terminal for fixation of the photoelectric conversion element is connected to the front-surface-side copper foil pattern, and the front-surface-side copper foil pattern and the back-surface-side copper foil pattern are connected by the through hole via. Thus, the heat generated from the photoelectric conversion element is transferred to the terminal for fixation, the front-surface-side copper foil pattern, the through hole via, and the back-surface-side copper foil pattern in series and dissipated. Therefore, it is possible to effectively cool the element with a simple configuration by securing a dissipation path for the heat generated from the photoelectric conversion element, and by making the thermal resistance between the photoelectric conversion element and the cooling member small for cooling the element effectively.

In the above-described aspect, it is preferable that the cooling member works as a heat sink which dissipates heat transmitted from the terminal for fixation and through the front-surface-side copper foil pattern, the through-hole via, and the back-surface-side copper foil pattern.

By employing this configuration, it becomes possible to reduce the thermal resistance between the photoelectric conversion element and the cooling member in order to cool the element effectively, and therefore it becomes possible to effectively cool the element with a simple configuration.

In the above-described aspect, it is preferable that the cooling member has a Peltier element for cooling the heat sink.

By employing this configuration, one surface of the Peltier element absorbs heat and the other surface generates heat when electrical current flows in the Peltier element. Therefore, by a configuration in which the absorbing surface has contact with the back-surface-side copper foil pattern and the heat is radiated from the heat generating surface, it is possible to reduce the thermal resistance between the photoelectric conversion element and the cooling member in order to cool the element effectively, and therefore it becomes possible to effectively cool the element with a simple configuration.

In the above-described aspect, it is preferable that the circuit board is provided with a through hole at an area where the signal terminal and the terminal for fixation are not disposed, wherein the heat sink has a protruding portion which penetrates through the through hole, and which has direct contact with the back surface of the photoelectric conversion element or which has contact with the back surface of the photoelectric conversion element via another member.

By employing this configuration, it becomes possible to directly cool the heat generated from the photoelectric conversion element because the protruding portion penetrates through the through hole and has contact with the back surface of the photoelectric conversion element. Therefore, it is possible to reduce the thermal resistance between the photoelectric conversion element and the cooling member in order to cool the element effectively, and therefore it becomes possible to effectively cool the element with a simple configuration.

In the above-described aspect, it is preferable that the cooling mechanism further comprises a heat transfer member which has contact with a periphery of a front surface of the photoelectric conversion element, and which is fixed to the front-surface-side copper foil pattern to transfer heat from the photoelectric conversion element to the front-surface-side copper foil pattern.

By employing this configuration, the heat generated from the photoelectric conversion element is transmitted to the front-surface-side copper foil pattern via the heat transfer member which has contact with the periphery of the front surface of the photoelectric conversion element, and thus the heat transfer path is made large. Therefore, it is possible to reduce the thermal resistance between the photoelectric conversion element and the cooling member in order to cool the element effectively, and therefore it becomes possible to effectively cool the element with a simple configuration.

In the above-described aspect, it is preferable that the cooling mechanism further comprises a housing which accommodates the circuit board and the cooling member in an airtight state, wherein a heat dissipation surface of the cooling member has contact with the housing.

By employing this configuration, it is possible to effectively cool the element with a simple configuration because the heat from the cooling member is effectively radiated by the housing.

In the above-described aspect, it is preferable that the terminal for fixation is provided on a periphery of the back surface of the photoelectric conversion element.

By employing this configuration, it is possible to reduce the thermal resistance between the photoelectric conversion element and the cooling member in order to cool the element effectively, and therefore it becomes possible to effectively cool the element with a simple configuration.

In the above-described aspect, it is preferable that the front-surface-side copper foil pattern has an exposure area which is located at an outside area relative to a periphery of the photoelectric conversion element in a state in which the photoelectric conversion element is mounted on the circuit board.

By employing this configuration, it is possible to reduce the thermal resistance between the photoelectric conversion element and the cooling member in order to cool the element effectively, and therefore it becomes possible to effectively cool the element with a simple configuration.

In the above-described aspect, it is preferable that the cooling mechanism further comprises a fixing portion which penetrates through a through hole provided in the exposure area and which fixes the cooling member to the back-surface-side copper foil pattern.

By employing this configuration, it is possible to cool the element in a more effective way and with a simple configuration, by effectively cooling the element by the fixing portion.

Advantageous Effects of Invention

The aforementioned aspects afford an advantage of effectively cooling the photoelectric conversion element with a simple configuration.

REFERENCE SIGNS LIST 10 housing heat radiation mechanism
100 imaging element
101 imaging element main body
101a main body front surface
101b main body back surface
101c main body side surface
102a unconnected external pin
102b external pin
103 external cover
103a front side cover
103b back side cover
103c side cover
104 front-surface-side copper foil pattern
105 through-hole via
106 bolt
107 back-surface-side copper foil pattern
108 cooling unit
108a copper-foil-pattern contact surface
108b screw hole
109 printed circuit board
110 through hole
111 protruding type cooling unit
111a copper-foil-pattern contact surface
111b screw hole
111c protruding portion
112 printed circuit board
113 copper foil pattern
114 heat transfer promoting member
115 copper foil pattern
116 printed circuit board
117 heat radiating member
118 opening portion

The invention claimed is:

1. A cooling mechanism for a surface-mounted-type photoelectric conversion element which has a plurality of signal terminals provided on a back surface of the photoelectric conversion element, and a terminal for fixation at the back surface, wherein the signal terminals are connected to internal wiring of the photoelectric conversion element and the terminal for fixation is not connected to the internal wiring of the photoelectric conversion element, the cooling mechanism comprising:
   a front-surface-side copper foil pattern which is provided on a front surface of a circuit board and to which the terminal for fixation is connected, the front surface being located at one side in the thickness direction of the circuit board;
   a back-surface-side copper foil pattern which is provided on a back surface of the circuit board, the back surface being located at the other side in the thickness direction of the circuit board;
   a through-hole via which connects the front-surface-side copper foil pattern and the back-surface-side copper foil pattern; and
   a cooling member which is fixed to the circuit board so as to have contact with the back-surface-side copper foil pattern, and which cools the back-surface-side copper foil pattern.

2. The cooling mechanism for a surface-mounted-type photoelectric conversion element according to claim 1, wherein the cooling member works as a heat sink which dissipates heat transmitted from the terminal for fixation and through the front-surface-side copper foil pattern, the through-hole via, and the back-surface-side copper foil pattern.

3. The cooling mechanism for a surface-mounted-type photoelectric conversion element according to claim 2, wherein the cooling member has a Peltier element for cooling the heat sink.

4. The cooling mechanism for a surface-mounted-type photoelectric conversion element according to claim 2, wherein the circuit board is provided with a through hole at an area where the signal terminal and the terminal for fixation are not disposed,
   wherein the heat sink has a protruding portion which penetrates through the through hole, and which has direct contact with the back surface of the photoelectric conversion element or which has contact with the back surface of the photoelectric conversion element via another member.

5. The cooling mechanism for a surface-mounted-type photoelectric conversion element according to claim 1, the cooling mechanism further comprising a heat transfer member which has contact with a periphery of a front surface of the photoelectric conversion element, and which is fixed to the front-surface-side copper foil pattern to transfer heat from the photoelectric conversion element to the front-surface-side copper foil pattern.

6. The cooling mechanism for a surface-mounted-type photoelectric conversion element according to claim 1, the cooling mechanism further comprising a housing which accommodates the circuit board and the cooling member in an airtight state,
   wherein a heat dissipation surface of the cooling member has contact with the housing.

7. The cooling mechanism for a surface-mounted-type photoelectric conversion element according to claim 1, wherein the terminal for fixation is provided on a periphery of the back surface of the photoelectric conversion element.

8. The cooling mechanism for a surface-mounted-type photoelectric conversion element according to claim 7, wherein the front-surface-side copper foil pattern has an exposure area which is located at an outside area relative to a periphery of the photoelectric conversion element in a state in which the photoelectric conversion element is mounted on the circuit board.

9. The cooling mechanism for a surface-mounted-type photoelectric conversion element according to claim 8, the cooling mechanism further comprising a fixing portion which penetrates through a through hole provided in the exposure area and which fixes the cooling member to the back-surface-side copper foil pattern.

* * * * *